(12) United States Patent
Balasubramanian

(10) Patent No.: US 8,963,601 B1
(45) Date of Patent: Feb. 24, 2015

(54) CLOCK GATED DELAY LINE BASED ON SETTING VALUE

(71) Applicant: Cavium, Inc., San Jose, CA (US)

(72) Inventor: Suresh Balasubramanian, Shrewsbury, MA (US)

(73) Assignee: Cavium, Inc., San Jose, CA (US)

( * ) Notice: Subject to any disclaimer, the term of this patent is extended or adjusted under 35 U.S.C. 154(b) by 0 days.

(21) Appl. No.: 14/015,601

(22) Filed: Aug. 30, 2013

(51) Int. Cl.
*H03H 11/26* (2006.01)
*H03K 3/011* (2006.01)
*H03K 5/14* (2014.01)

(52) U.S. Cl.
CPC . *H03K 3/011* (2013.01); *H03K 5/14* (2013.01)
USPC .............................. 327/278; 327/276; 327/261

(58) Field of Classification Search
USPC ......... 327/246, 247, 266, 274, 287, 261, 276, 327/278
See application file for complete search history.

(56) References Cited

U.S. PATENT DOCUMENTS

| 6,756,832 B2 * | 6/2004 | Reuveni et al. | 327/271 |
| 7,525,356 B2 * | 4/2009 | Hui et al. | 327/161 |
| 8,692,602 B2 * | 4/2014 | Chou | 327/277 |

* cited by examiner

*Primary Examiner* — Hai L Nguyen
(74) *Attorney, Agent, or Firm* — Hamilton, Brook, Smith & Reynolds, P.C.

(57) ABSTRACT

In an embodiment, a delay circuit includes a delay line with a clock input signal and a delayed clock output signal that is based on a setting value. Each delay element of the delay line receives one of several delay element select signals and outputs a delayed signal based on the delay element select signal. The setting value may be a binary encoded value representing the desired delay. The delay element select signals may correspond to a thermometer encoded value of the binary encoded setting value.

4 Claims, 3 Drawing Sheets

FIG. 1: PRIOR ART

CLOCK GATED DELAY LINE BASED ON SETTING VALUE

BACKGROUND

Typical integrated circuits (ICs) have large numbers of elements that are synchronized to a system clock. Different clock distribution methods can be used to distribute the system clock across the chip to these elements. However, as the clock signal propagates through the clock distribution structure, issues such as process, voltage and temperature variations can affect the delay of the clock signal. In order to ensure proper synchronous behavior, the clock signals arriving at these elements may need to be aligned to the system clock. Delay locked loops (DLLs) are typically used to align the distributed clock signals to a reference clock prior to their use by the synchronous elements.

SUMMARY

Embodiments of the present invention provide for a delay locked loop (DLL) comprising a delay line with a clock input signal and a delayed clock output signal that is based on a setting value. The delay line includes a plurality of delay elements. Each delay element receives one of several delay element select signals and outputs a delayed signal based on the delay element select signal. The setting value may be a binary encoded value representing the desired delay. The delay element select signals may correspond to a thermometer encoded value of the binary encoded setting value. Additionally, each delay element may be a two input multiplexer where the second input is connected to ground. Configured in this manner, the delay element select signal can allow the input signal to propagate through the multiplexer. In this case, the input signal is delayed by a fixed unit of delay. The delay element select signal can also block the input signal to propagate through the multiplexer.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION

A description of example embodiments of the invention follows.

A typical delay locked loop (DLL) circuit uses the output of a phase detector to add delay to a given clock to align it with the rising/falling edge of an incoming reference clock. Embodiments of the present invention provide a DLL that requires significantly less power than a typical DLL.

Figure 1:
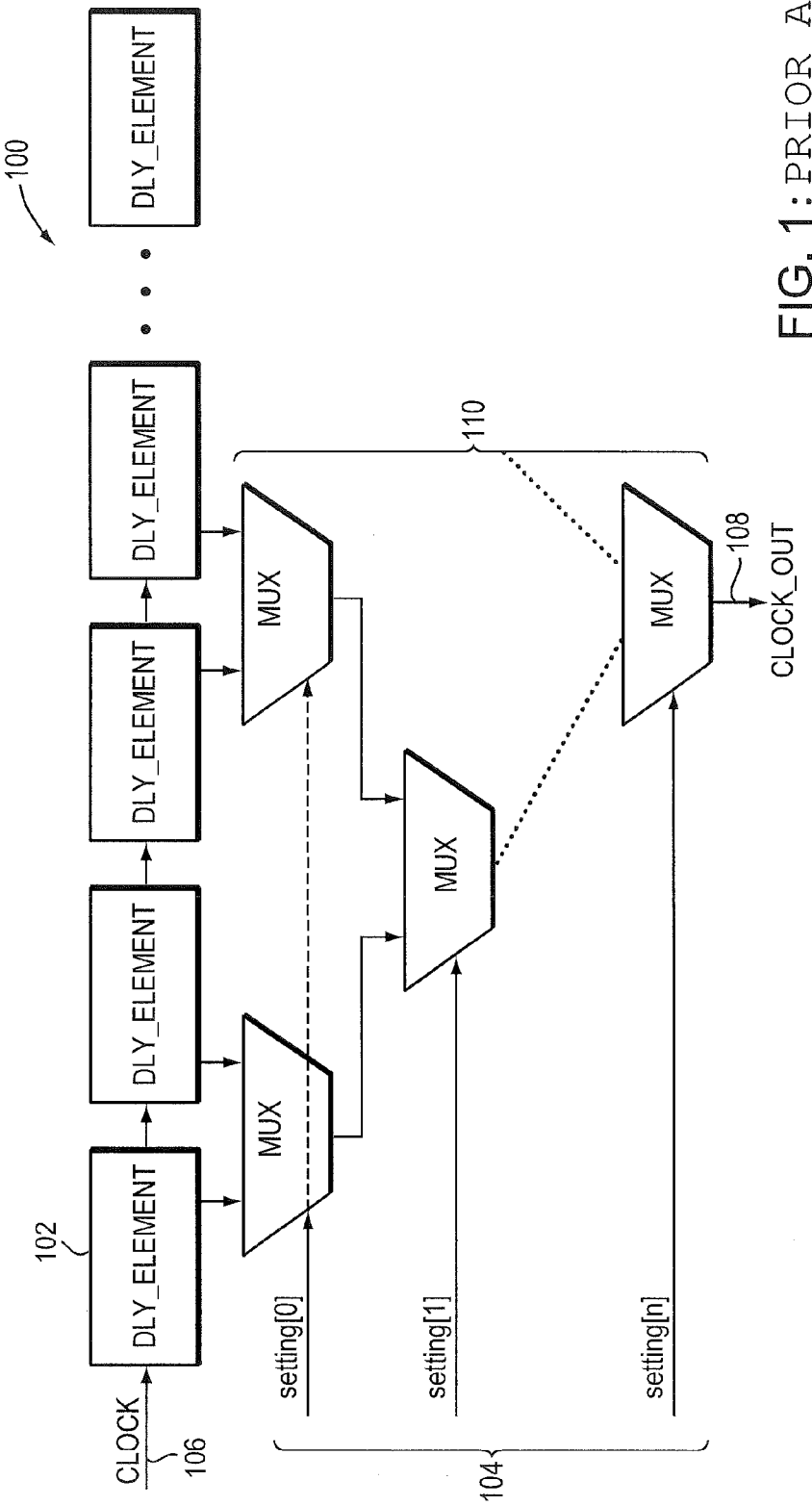
FIG. 1 is a block diagram showing a delay line circuit in a typical delay locked loop (DLL).

FIG. 1 is a block diagram illustrating a delay line circuit in a typical DLL 100. A digital delay line consists of a string of delay elements (DLY_ELEMENT) 102. The delay elements are usually a string of inverters that add a fixed unit of delay to the signal as it propagates through the delay line. The incoming clock signal (CLOCK) 106 into the delay line propagates through the chain of delay elements. The clock signal with the desired delay (CLOCK OUT) 108 is selected from one of the delayed signals from the delay line. The desired delay is chosen by using a binary multiplexer tree 110 with the select signals provided by the binary encoded setting value (setting[n:0]) 104.

When a high activity signal such as a clock signal is used as an input into the delay line, it results in a significant amount of power consumption as the signal propagates through the entire delay line regardless of the required delay. In wide range DLL architectures, the same delay line is used to lock for clock frequencies ranging, for example, from 400 MHz to 2 GHz. At higher clock frequencies, a significant amount of dynamic power is wasted even though only a small portion of the delay is used for generating delay for clock alignment.

Figure 2:
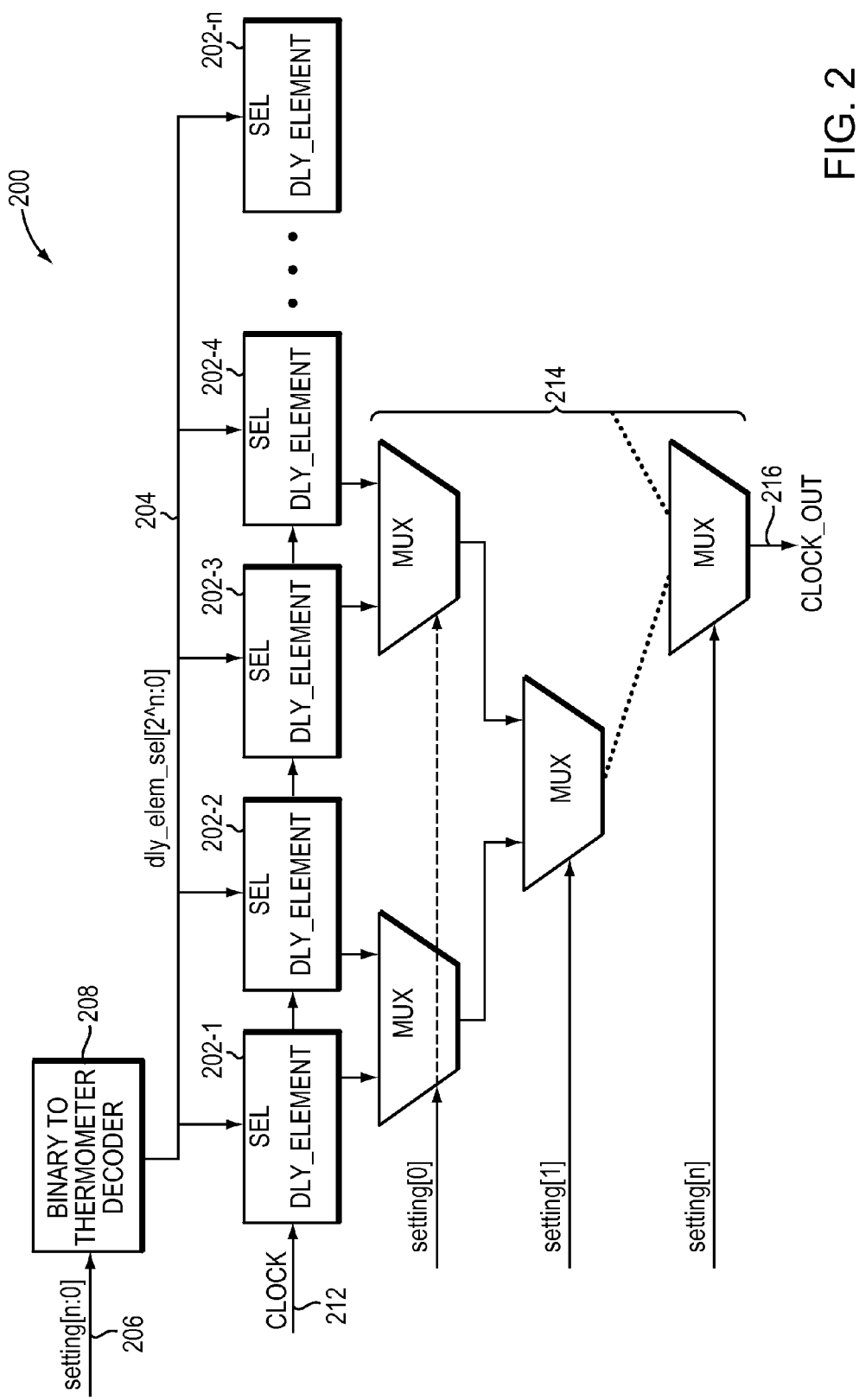
FIG. 2 is block diagram showing an embodiment of a delay line circuit in accordance with the present invention.
Figure 3:
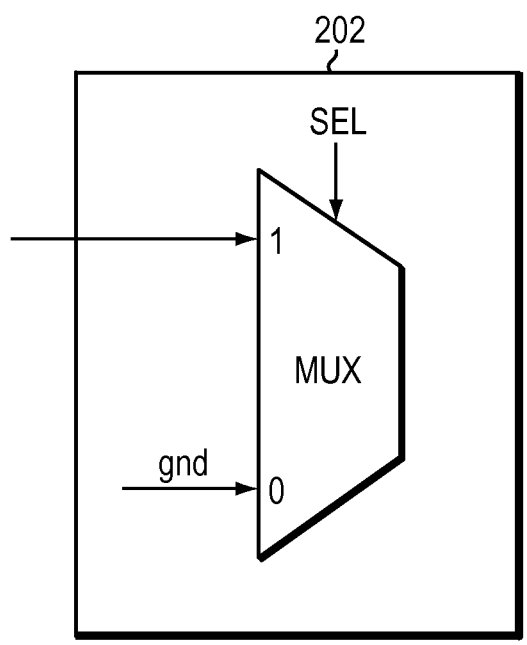
FIG. 3 illustrates a delay element.

FIG. 2 is a block diagram of a delay line circuit 200 in an example embodiment of the present invention. Each delay element (202-1, 202-2, 202-3, 202-4, ... 202-n) has a select signal (dly_sel) 204 that controls whether the signal is propagated through the delay element. In this embodiment, each delay element 202 is a two input multiplexer, where the first input is the signal to be propagated through the delay element and the second input is connected to ground (FIG. 3). Depending on the value of the select signal (SEL), the incoming signal is allowed to propagate through the delay element.

Using the delay element select signals (dly_sel) 204, the clock signal is propagated only through the required delay elements. A multiplexer tree 214 is used to select the delayed output clock signal (CLOCK_OUT) 216. For wide range clock architectures, embodiments of the present invention result in significantly less power consumption by preventing unnecessary circuit switching activity.

In FIG. 2, the setting value (setting [n:0]) 206 is a binary encoded version of the desired delay of n delay units, each delay element 202 corresponding to a unit of delay. The select line values 204 for the delay line may be a thermometer encoded representation dly_sel [2^n−1:0] of the binary encoded setting value provided via a binary-to-thermometer encoder 208. The thermometer encoded representation allows clock signal 212 to propagate through only those delay elements needed for generating the desired delay. Because the clock signal is not propagated beyond the selected delay elements, switching activity beyond the selected delay elements is eliminated, thereby reducing unnecessary power consumption. In contrast, in a typical DLL delay line, as shown in FIG. 1, the clock input signal propagates through the entire delay line regardless of the desired delay and thereby results in unnecessary power consumption.

As an example of operation of the delay line circuit of FIG. 2, consider the case where the delay line includes 8 delay elements. In this case, the binary encoded setting value uses three bits to represent delays of between 1 and 8 units of delay. A desired delay of 2 units, for example, results in a setting value 206 of 010. The corresponding thermometer encoded representation 204 of the setting value 010 results in delay element select values of 11000000. With this particular thermometer encoded representation, the first two delay elements 202-1, 202-2 are selected while the rest of the delay elements (202-3, ... 202-8) are prevented from propagating the input clock signal through the delay line.

Other embodiments of the invention may use a different method for generating the delay element select values. While the example embodiment of FIG. 2 employs a multiplexer tree 214 for selecting the delayed output clock signal (CLOCK_OUT), other embodiments may use logic gates or other circuitry for selecting the delayed output clock signal.

While this invention has been particularly shown and described with references to example embodiments thereof, it will be understood by those skilled in the art that various changes in form and details may be made therein without departing from the scope of the invention encompassed by the appended claims.

What is claimed is:

1. A delay circuit comprising:
   a delay line configured to receive a clock input signal, a setting value and a plurality of delay element select signals and to output a delayed clock signal based on the setting value,
   the delay line comprising a plurality of delay elements connected in series, each delay element configured to receive one of the plurality of delay element select signals and output a delayed signal based on the delay element select signal,
   wherein each delay element is a multiplexer having a first input configured to receive an input signal corresponding to the outputs of the delay element preceding in the series, a second input connected to ground and a multiplexer select input connected to the corresponding delay element select signal.

2. The delay circuit of claim 1, wherein the setting value is a binary encoded value.

3. The delay circuit of claim 1, wherein the delay element select signals correspond to a thermometer encoded value.

4. The delay circuit of claim 3, wherein the delay element select signals correspond to a thermometer encoded representation of a binary encoded setting value.

* * * * *